US010734430B2

(12) United States Patent
Hong et al.

(10) Patent No.: US 10,734,430 B2
(45) Date of Patent: Aug. 4, 2020

(54) SEMICONDUCTOR DEVICE INCLUDING THROUGH VIA, SEMICONDUCTOR PACKAGE, AND METHOD OF FABRICATING THE SAME

(71) Applicant: Samsung Electronics Co., Ltd., Suwon-si, Gyeonggi-do (KR)

(72) Inventors: Yi Koan Hong, Yongin-si (KR); Taeseong Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/233,900

(22) Filed: Dec. 27, 2018

(65) Prior Publication Data
US 2019/0386051 A1 Dec. 19, 2019

(30) Foreign Application Priority Data
Jun. 14, 2018 (KR) .......................... 10-2018-0068289

(51) Int. Cl.
*H01L 23/48* (2006.01)
*H01L 27/146* (2006.01)
*H01L 21/768* (2006.01)
*H01L 23/00* (2006.01)

(52) U.S. Cl.
CPC .. *H01L 27/14634* (2013.01); *H01L 21/76898* (2013.01); *H01L 23/481* (2013.01); *H01L 24/08* (2013.01); *H01L 24/80* (2013.01); *H01L 27/1469* (2013.01); *H01L 27/14636* (2013.01); *H01L 27/14645* (2013.01); *H01L 2224/08146* (2013.01); *H01L 2224/80894* (2013.01)

(58) Field of Classification Search
CPC . H01L 21/14634; H01L 23/481; H01L 24/08; H01L 24/80; H01L 27/14634; H01L 27/14636; H01L 27/14645
USPC ................................................. 257/292, 774
See application file for complete search history.

(56) References Cited

U.S. PATENT DOCUMENTS

| 6,699,787 B2 * | 3/2004 | Mashino ............... H01L 23/481 257/E23.011 |
| 7,459,774 B2 | 12/2008 | Kwon et al. |
| 7,528,494 B2 | 5/2009 | Furukawa et al. |

(Continued)

OTHER PUBLICATIONS

H. Deligianni' et al, "Electrochemical Processes in ULSI and MEMS," Proceeding vols. 2004-17.
(Continued)

*Primary Examiner* — Tan N Tran
(74) *Attorney, Agent, or Firm* — Harness, Dickey & Pierce, P.L.C.

(57) ABSTRACT

A semiconductor device including a first structure including a first conductive pattern, the first conductive pattern exposed on an upper portion of the first structure, a mold layer covering the first conductive pattern, a second structure on the mold layer, and a through via penetrating the second structure and the mold layer, the through via electrically connected to the first conductive pattern, the through via including a first via segment in the second structure and a second via segment in the mold layer, the second via segment connected to the first via segment, an upper portion of the second via segment having a first width and a middle portion of the second via segment having a second width greater than the first width may be provided.

11 Claims, 16 Drawing Sheets

(56) References Cited

U.S. PATENT DOCUMENTS

| | | |
|---|---|---|
| 8,143,097 B2 | 3/2012 | Chi et al. |
| 8,563,403 B1 | 10/2013 | Farooq et al. |
| 8,860,229 B1 | 10/2014 | Lin |
| 8,957,526 B2 | 2/2015 | Chun et al. |
| 9,076,664 B2 * | 7/2015 | Pelley ................. H01L 25/0657 |
| 9,461,007 B2 | 10/2016 | Chun et al. |
| 2008/0217790 A1 * | 9/2008 | Hasunuma ........ H01L 21/76804 |
| | | 257/774 |
| 2012/0273940 A1 | 11/2012 | Jo |
| 2015/0340422 A1 | 11/2015 | Lee et al. |
| 2017/0186659 A1 | 6/2017 | Moon et al. |
| 2017/0365537 A1 | 12/2017 | Jewler |

OTHER PUBLICATIONS

Etch Rates for Micromachining Processing—Part II' , 'Kirt R. Williams' etal, Journal of Microelectromechanical Systems, vol. 12, No. 6, Dec. 2003.

'Dynamic Wet Etching of Silicon through Isopropanol Alcohol Evaporation', 'Tiago S. Monteiro' etal, Micromachines 2015, 6, 1534-1545; doi:10.3390/mi6101437.

* cited by examiner

SEMICONDUCTOR DEVICE INCLUDING THROUGH VIA, SEMICONDUCTOR PACKAGE, AND METHOD OF FABRICATING THE SAME

CROSS-REFERENCE TO RELATED APPLICATION

This U.S. nonprovisional application claims priority under 35 U.S.C § 119 to Korean Patent Application No. 10-2018-0068289 filed on Jun. 14, 2018 in the Korean Intellectual Property Office, the entire contents of which are hereby incorporated by reference.

BACKGROUND

The present inventive concepts relate to semiconductor devices including a through via, semiconductor packages, and/or methods of fabricating the same.

Recently, there have been increasing demands for lighter, smaller, faster, multifunctional, and/or highly reliable products (e.g., mobile phones or laptop computers) in the electronic industry. In order to meet such requirements, research on the semiconductor package technology has been continuously carried out. Integrated circuits manufactured using conventional wire bonding techniques have some disadvantages such as signal loss, relative high power consumption, and/or design constraints on bonding wires. Thus, an integrated circuit package technology in which semiconductor chips are stacked and vertically connected to each other using a through silicon via (TSV) has been developed to overcome the disadvantages of the wire bonding techniques. According to this technology, highly-integrated circuits can be implemented on a same unit space and/or shorter circuit-to-circuit connections can be implemented, compared to the wire bonding technique. Recently, various studies are being conducted to improve reliability and electrical characteristics of semiconductor packages fabricated by using the TSV techniques.

SUMMARY

Some example embodiments of the present inventive concepts provide semiconductor devices with enhanced reliability.

Some example embodiments of the present inventive concepts provide semiconductor packages with enhanced reliability.

Some example embodiments of the present inventive concepts provide methods of fabricating a semiconductor device with enhanced reliability.

According to an example embodiment of the present inventive concepts, a semiconductor device includes a first structure including a first conductive pattern, the first conductive pattern exposed on an upper portion of the first structure, a mold layer covering the first conductive pattern, a second structure on the mold layer, and a through via penetrating the second structure and the mold layer, the through via electrically connected to the first conductive pattern, the through via including a first via segment in the second structure and a second via segment in the mold layer, the second via segment connected to the first via segment, an upper portion of the second via segment having a first width and a middle portion of the second via segment having a second width greater than the first width.

According to an example embodiment of the present inventive concepts, a semiconductor package includes a first semiconductor chip including a first conductive pattern, the first conductive pattern exposed on an upper portion of the first semiconductor chip, a mold layer contacting the first conductive pattern and covering the first semiconductor chip, a second semiconductor chip on the mold layer, and a through via penetrating the second semiconductor chip and the mold layer, the through via electrically connected to the first conductive pattern, the through via including a first via segment in the second semiconductor chip and a second via segment in the mold layer, the second via segment connected to the first via segment, an upper portion of the second via segment having a first width and a middle portion of the second via segment having a second width greater than the first width.

According to an example embodiment of the present inventive concepts, a method of fabricating a semiconductor device includes forming a preliminary structure, the preliminary structure including a first structure including a first conductive pattern, the first conductive pattern exposed on an upper portion of the first structure, a mold layer covering the first conductive pattern, and a second structure on the mold layer, etching the second structure to form a first hole that exposes the mold layer, etching the mold layer to form a second hole that exposes the first conductive pattern and overlaps the first hole, and forming a through via that fills the first and second holes.

DETAILED DESCRIPTION

Some example embodiments of the present inventive concepts will now be described in detail with reference to the accompanying drawings to aid in clearly explaining the present inventive concepts.

Figure 1A:
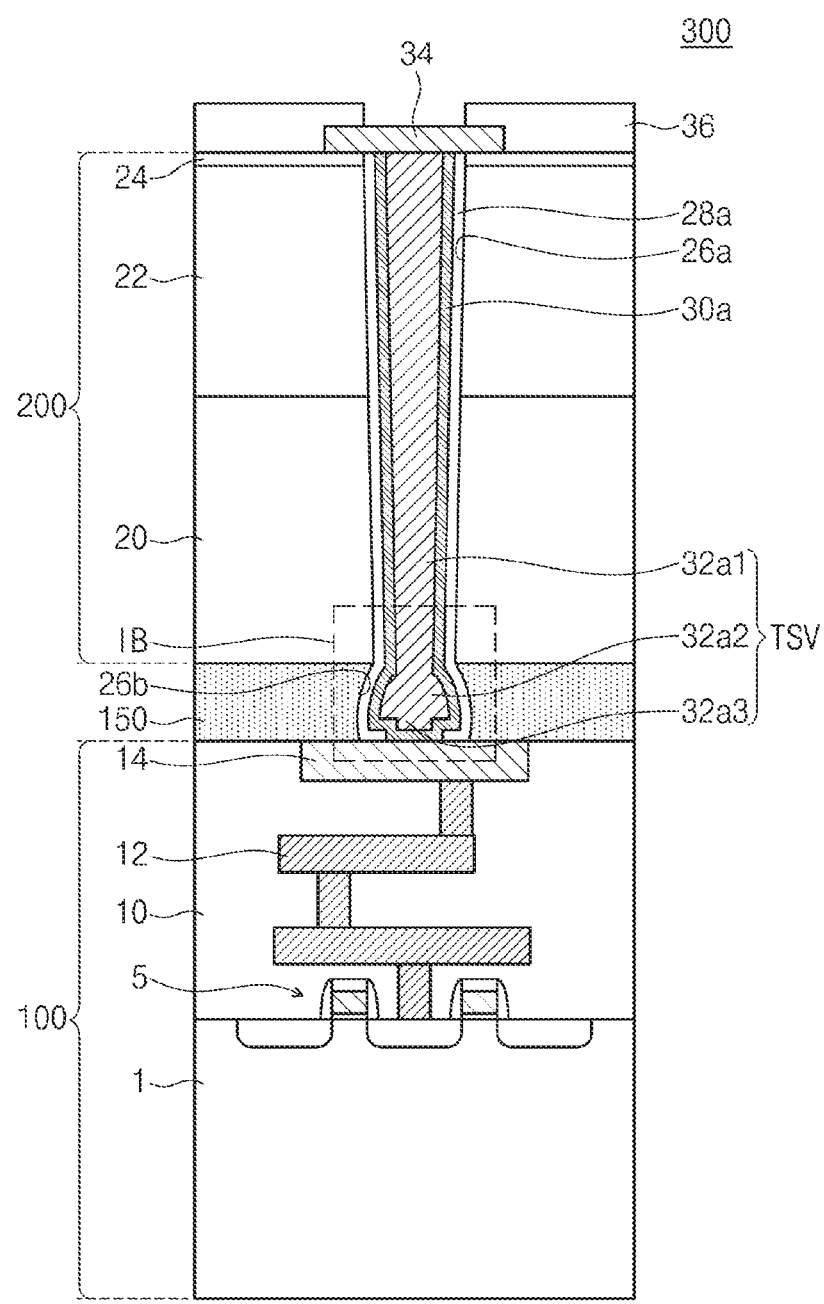
FIG. 1A illustrates a cross-sectional view showing a semiconductor device according to an example embodiment of the present inventive concepts.
Figure 1B:
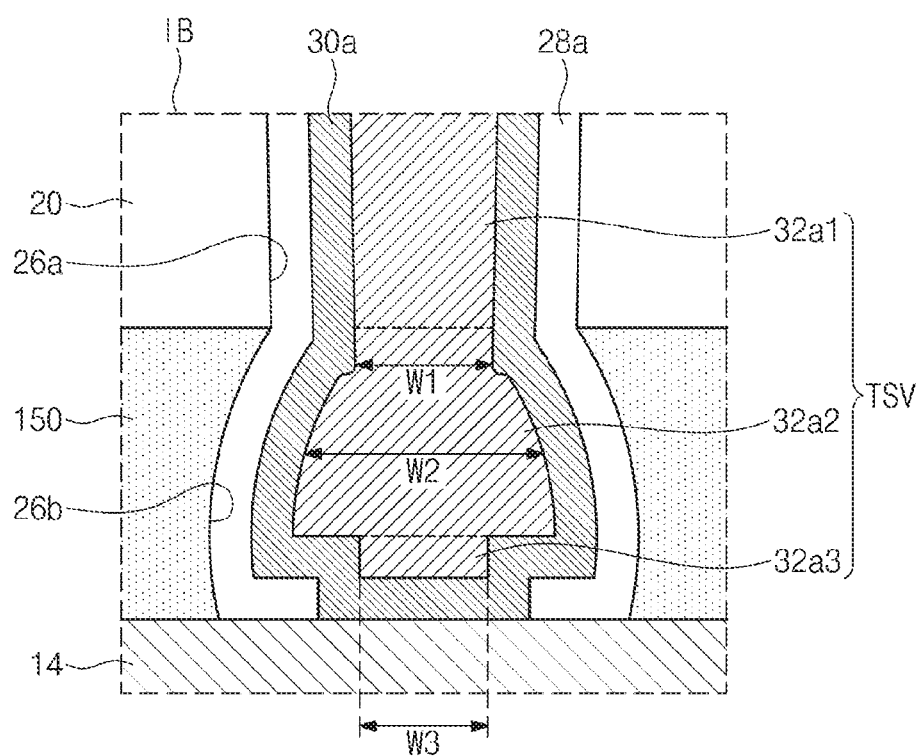
FIG. 1B illustrates an enlarged view showing a section IB of FIG. 1A.

FIG. 1A illustrates a cross-sectional view showing a semiconductor device according to an example embodiment of the present inventive concepts. FIG. 1B illustrates an enlarged view showing a section IB of FIG. 1A.

Referring to FIGS. 1A and 1B, a semiconductor device 300 according to an example embodiment may include a first structure 100 and a second structure 200 stacked on the first structure 100. The semiconductor device 300 may be a constituent part of a semiconductor package. The first structure 100 may be or include a first semiconductor chip. The second structure 200 may be or include a second semiconductor chip. The first structure 100 may include a first semiconductor substrate 1, first transistors 5 disposed on the first semiconductor substrate 1, a first interlayer dielectric structure 10 having a plurality of dielectric layers and covering the first transistors 5, first interconnection lines 12 disposed in the first interlayer dielectric structure 10, and a first conductive pattern 14 electrically connected to the first interconnection lines 12. The first conductive pattern 14 may be exposed on an upper portion of the first structure 100. The first semiconductor substrate 1 may be or include, for example, a single crystalline silicon substrate. The first interlayer dielectric structure 10 may include a plurality of dielectric layers including, for example, at least two or more of a silicon oxide layer, a silicon nitride layer, a silicon oxynitride layer, or a porous low-k dielectric layer. The first interconnection lines 12 and the first conductive pattern 14 may include metal (e.g., aluminum, copper, or tungsten).

The second structure 200 may include a second semiconductor substrate 22 and a second interlayer dielectric layer 20. FIG. 1A shows that the second semiconductor substrate 22 is disposed on the second interlayer dielectric layer 20, but the second semiconductor substrate 22 and the second interlayer dielectric layer 20 may exchange their position to each other. Although not shown, second transistors may be disposed on the second semiconductor substrate 22. The second interlayer dielectric structure 20 may have a plurality of dielectric layers. Although not shown, multi-layered second interconnection lines may be disposed in the second interlayer dielectric layer 20. A first capping layer 24 may be disposed on the second semiconductor substrate 22. The second semiconductor substrate 22 may be or include, for example, a single crystalline silicon substrate. The second interlayer dielectric structure 20 may include multiple layers including, for example, at least two or more of a silicon oxide layer, a silicon nitride layer, a silicon oxynitride layer, or a porous low-k dielectric layer.

A mold layer 150 may be interposed between the first and second structures 100 and 200. The mold layer 150 may include a material having an etch selectivity with respect to a material (e.g., silicon, silicon nitride, silicon oxide, silicon oxynitride) constituting at least the second structure 200. The mold layer 150 may include a polymeric material. For example, the mold layer 150 may have a low-dielectric constant equal to or less than about 3. The mold layer 150 may include, for example, at least one of a fluorine-based polymer, a fluorocarbon polymer, a polar polymer, or a non-polar polymer. The mold layer 150 may include a non-conductive film (NCF), a thermosetting resin, or a photocurable resin. The mold layer 150 may be or include a viscous adhesive layer.

A first hole 26a may be disposed in the second structure 200. A second hole 26b may be disposed in the mold layer 150 and overlap the first hole 26a. The first hole 26a may have a width that decreases as approaching the mold layer 150. The second hole 26b may have a lateral surface that is curved. For example, the lateral surface of the second hole 26b may have a sidewall profile that resembles a portion of an elliptical shape.

A through via TSV may be disposed in the first and second holes 26a and 26b. The through via TSV may include a first via segment 32a1 disposed in the first hole 26a, and second and third via segments 32a2 and 32a3 disposed in the second hole 26b. The first, second, and third via segments 32a1, 32a2, and 32a3 may be connected into a single integral body. The second via segment 32a2 may have a first width W1 at its upper portion and a second width W2 at its middle portion (see FIG. 1B). The first width W1 may be less than the second width W2. The third via segment 32a3 may be adjacent to the first conductive pattern 14. The third via segment 32a3 may have a third width W3 at its bottom end. The third width W3 may be less than the second width W2. The through via TSV may include metal, for example, aluminum, copper, and/or tungsten. The second and third via segments 32a2 and 32a3 may also be collectively called as a landing pad.

A via insulation pattern 28a may cover a sidewall of each of the first and second holes 26a and 26b. The via insulation pattern 28a may have a portion interposed between the second via segment 32a2 and the first conductive pattern 14. A via diffusion break pattern 30a may include a first portion interposed between the through via TSV and the via insulation pattern 28a and a second portion interposed between the through via TSV and the first conductive pattern 14. The via insulation pattern 28a may be formed of a dielectric layer, for example, a silicon layer, a silicon nitride layer, a silicon oxide layer, or a silicon oxynitride layer. The via diffusion break pattern 30a may include a metal nitride layer, for example, a titanium nitride layer, a tungsten nitride layer, or a tantalum nitride layer.

A second conductive pattern 34 may be disposed on the through via TSV. A second capping layer 36 may be provided on the first capping layer 24 and partially expose the second conductive pattern 34 therethrough. The second conductive pattern 34 may include metal, for example, aluminum, copper, and/or tungsten. The first capping layer 24 may be formed of or include a dielectric layer, for example, a silicon nitride layer or a silicon nitride layer. The second capping layer 36 may be formed of or include, for example, a silicon nitride layer or a polyimide layer.

FIGS. 2A to 2G illustrate cross-sectional views showing a method of fabricating a semiconductor device having the cross-section of FIG. 1A, according to an example embodiment of the present inventive concepts.

Figure 2A:
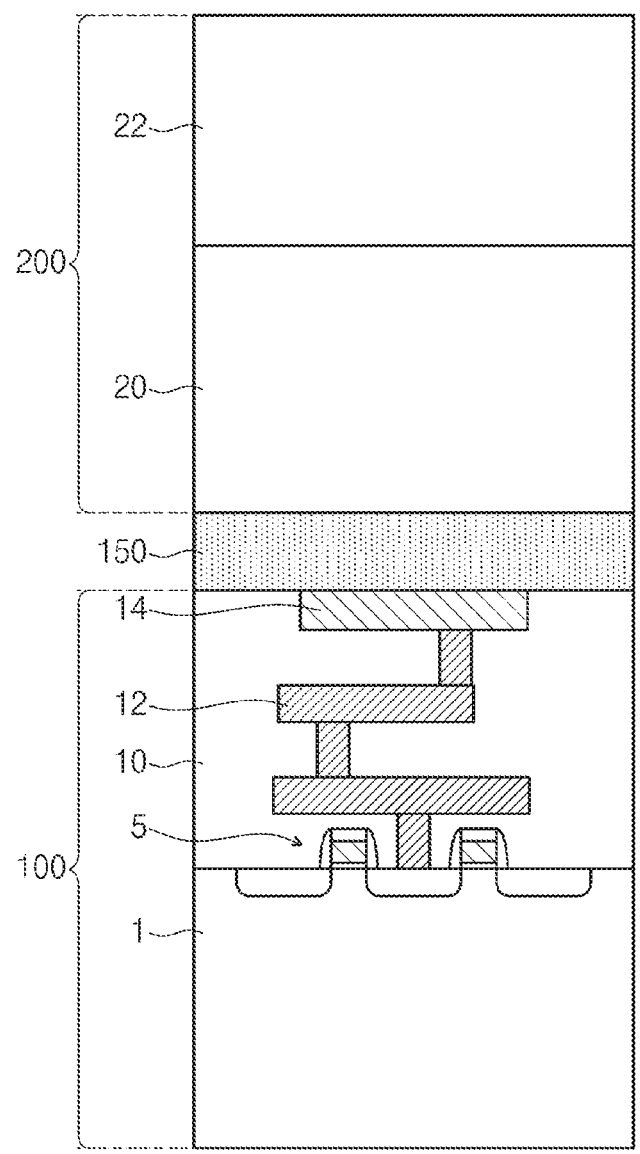
FIGS. 2A to 2G illustrate cross-sectional views showing a method of fabricating a semiconductor device having the cross-section of FIG. 1A, according to an example embodiment of the present inventive concepts.

Referring to FIG. 2A, a first structure 100 may be provided. The first structure 100 may include a first semiconductor substrate 1, first transistors 5 disposed on the first semiconductor substrate 1, a first interlayer dielectric structure 10 having a plurality of dielectric layers and covering the first transistors 5, first interconnection lines 12 disposed in the first interlayer dielectric structure 10, and a first conductive pattern 14 electrically connected to the first interconnection lines 12. The first conductive pattern 14 may be exposed on an upper portion of the first structure 100. A mold layer 150 may be formed on the first structure 100. The mold layer 150 may be formed of a polymeric material. For example, the mold layer 150 may have a low-dielectric constant equal to or less than about 3. The mold layer 150 may include, for example, at least one of a fluorine-based polymer, a fluorocarbon polymer, a polar polymer, or a non-polar polymer. The mold layer 150 may include a non-conductive film (NCF), a thermosetting resin, or a photocurable resin. The mold layer 150 may be or include a viscous adhesive layer.

The formation of the mold layer 150 may include coating a thermosetting resin solution or a polymeric resin solution on the first structure 100, and then providing heat or light to cure the thermosetting resin solution or the polymeric resin solution. In some example embodiments, the mold layer 150 may be an adhesive layer, which is capable of being attached to the first structure 100. A second structure 200 may be coupled to the first structure 100 by the mold layer 150. The second structure 200 may include a second semiconductor substrate 22 and a second interlayer dielectric layer 20. In order to bond the second structure 200 to the mold layer 150, a plasma treatment using oxygen or the like may be performed on a surface of the mold layer 150. The mold layer 150 may thus have an increased bonding energy at the surface thereof. After the second structure 200 is placed on the mold layer 150, the second structure 200 may be thermally pressed and bonded to the mold layer 150. When the mold layer 150 is an adhesive layer, the second structure 200 may be adhered to the mold layer 150.

Figure 2B:
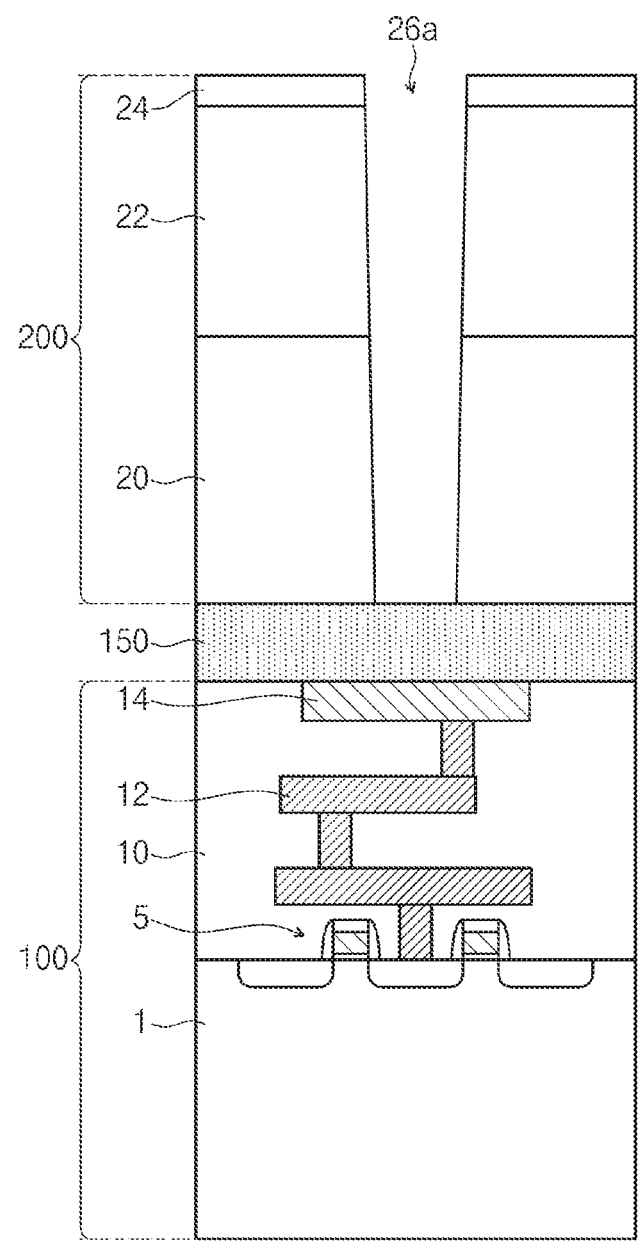

Referring to FIG. 2B, a first capping layer 24 may be formed on the second structure 200. A mask pattern (not shown) may be used to pattern the first capping layer 24. The first capping layer 24 and the mask pattern (not shown) may be used as an etching mask to etch the second structure 200 to form a first hole 26a that exposes the mold layer 150. At this stage, the second semiconductor substrate 22 and the second interlayer dielectric layer 20 may be successively etched. The mask pattern (not shown) may be completely etched and removed during the formation of the first hole 26a. An anisotropic etching process may be employed to etch the second structure 200. The mold layer 150 may act as an etch stop layer when the second structure 200 is etched.

Figure 2C:
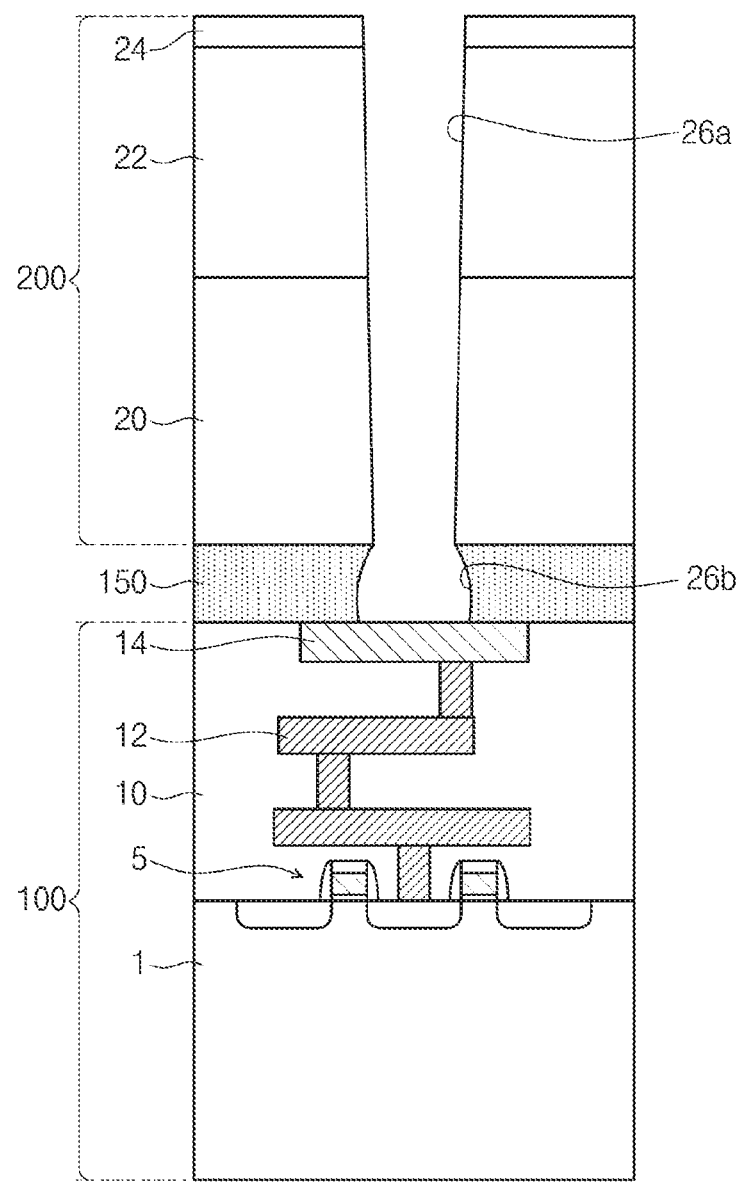

Referring to FIG. 2C, the mold layer 150 may be etched at a portion exposed by the first hole 26a, and thus a second hole 26b may be formed to expose the first conductive pattern 14. The etching of the mold layer 150 may be performed by using an isotropic etching process in which a first etchant is used. The first etchant may include a material having a contact angle of about 10 to 65 degrees relative to both the second structure 200 including a silicon layer, a silicon oxide layer, and a silicon nitride layer and the mold layer 150. The first etchant may include, for example, at least one of isopropyl alcohol or acetone. A shape of the second hole 26b may be determined by controlling or selecting a thickness of the mold layer 150, a concentration of the first etchant, the contact angle of the first etchant, a duration time of the first etchant, and the like. The second hole 26b may be formed to have a rounded sidewall. Because the mold layer 150 is etched by the isotropic etching process, the first conductive layer 14 may have no or insignificant etching damage to a surface thereof during the isotropic etching process. Thus, not-open issues or incomplete etching problems may be solved. The isotropic etching process may have an effect of cleaning the surface of the first conductive pattern 14 exposed by the second hole 26b. As a result, a cleaning process may be omitted to simplify a manufacturing process. Furthermore, a fabrication yield may be increased.

Figure 2D:
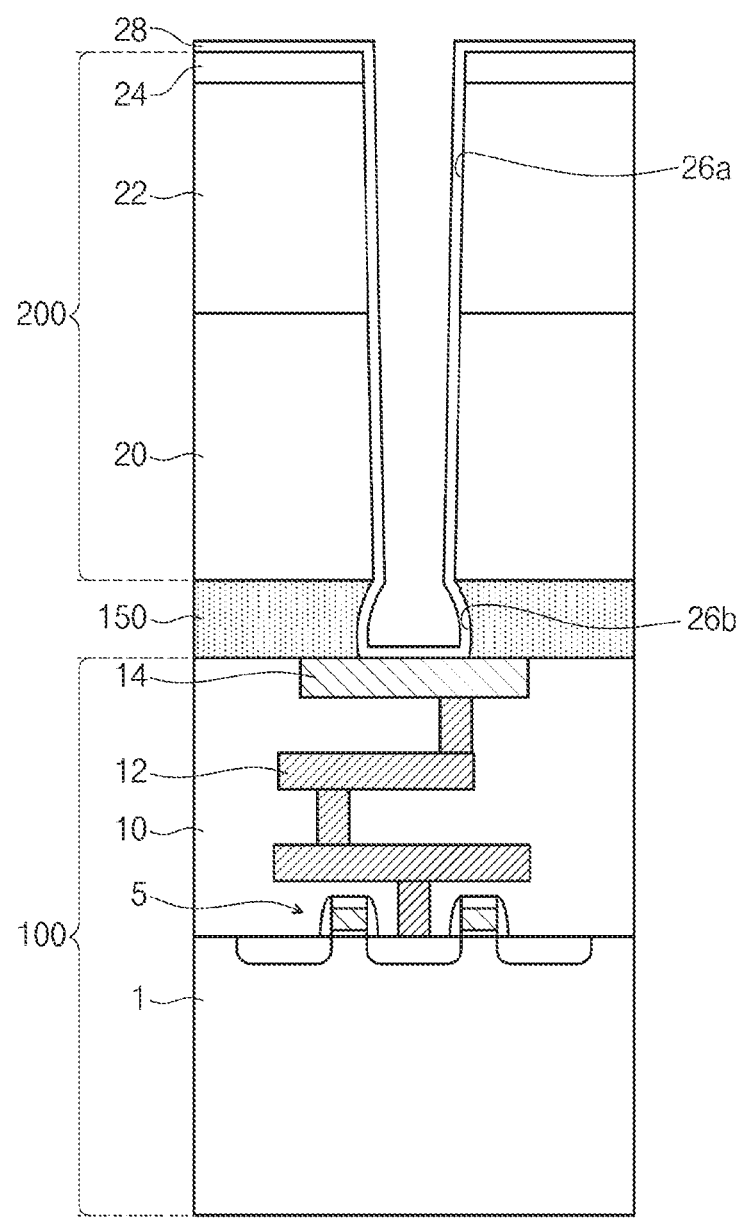

Referring to FIG. 2D, a via dielectric layer 28 may be conformally formed on a resultant structure of FIG. 2C. The via dielectric layer 28 may be formed of at least one of a silicon oxide layer, a silicon nitride layer, or a silicon oxynitride layer. The via dielectric layer 28 may cover inner sidewalls of the first and second holes 26a and 26b and a top surface of the first conductive pattern 14.

Figure 2E:
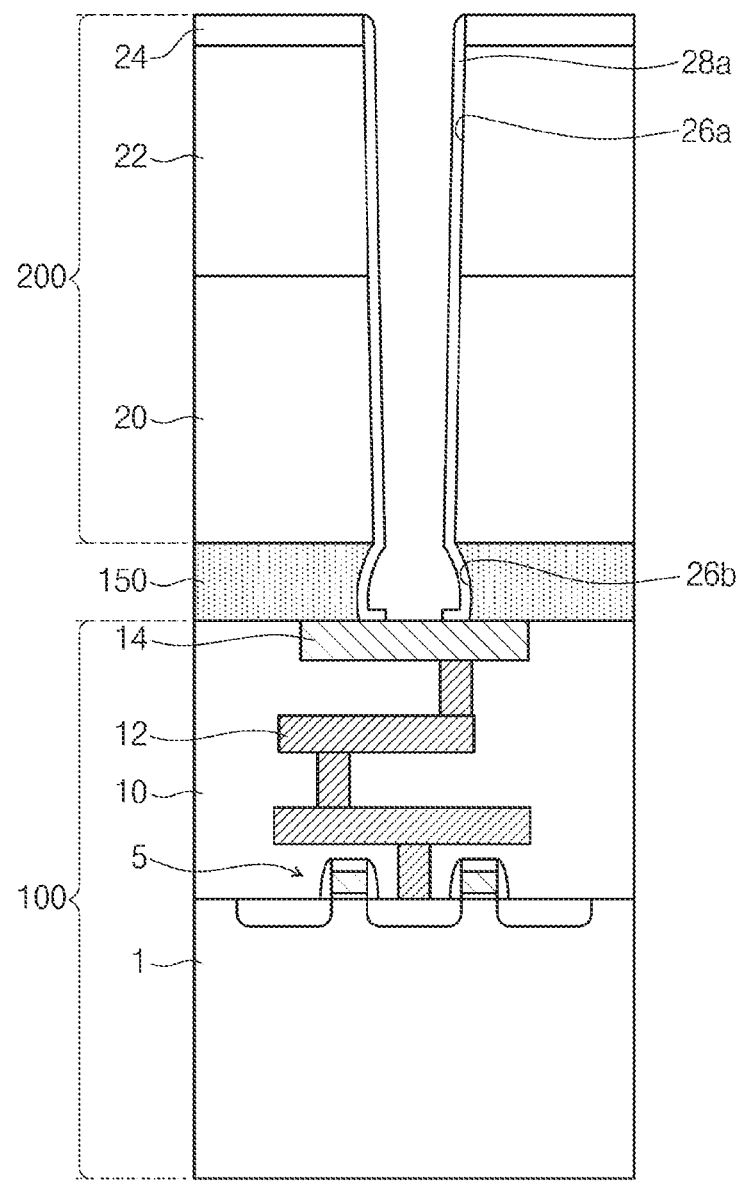

Referring to FIG. 2E, the via dielectric layer 28 may undergo an anisotropic etching process to form a via insulation pattern 28a such that a top surface of the first capping layer 24 is exposed, and a portion of the top surface of the first conductive pattern 14 is exposed. A portion of the via insulation pattern 28a may contact the top surface of the first conductive pattern 14.

Figure 2F:
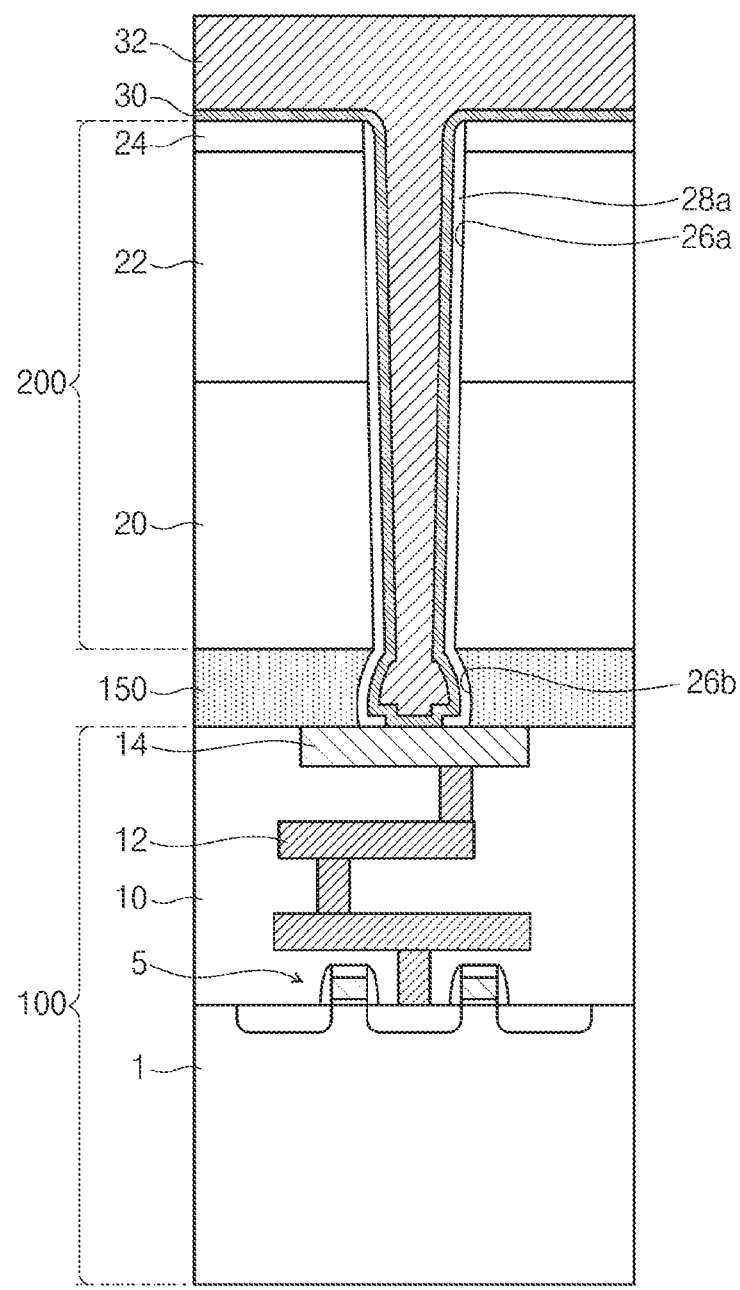

Referring to FIG. 2F, a via diffusion break layer 30 may be conformally formed on a resultant structure of FIG. 2E. A via conductive layer 32 may be stacked on the via diffusion break layer 30, filling the first and second holes 26a and 26b. The via diffusion break layer 30 may include a metal nitride layer, for example, a titanium nitride layer, a tantalum nitride layer, or a tungsten nitride layer.

Figure 2G:
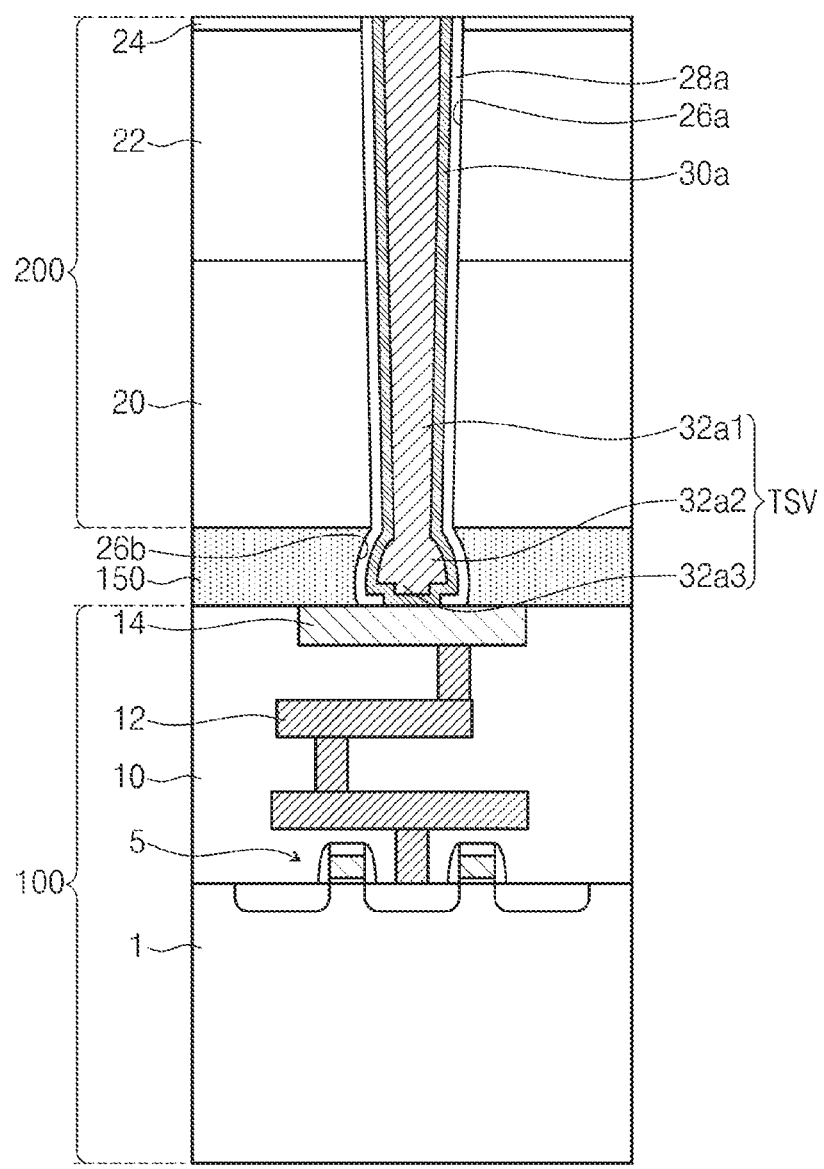

Referring to FIG. 2G, a chemical mechanical polishing (CMP) process may be performed to remove the via diffusion break layer 30 and the via conductive layer 32 that are formed on the first capping layer 24 to form a via diffusion break pattern 30a and a through via TSV that are disposed in the first and second holes 26a and 26b.

Referring back to FIG. 1A, a second conductive pattern 34 and a second capping layer 36 may be formed on the through via TSV. The second conductive pattern 34 may be formed by depositing and patterning a conductive layer. A portion of the second conductive pattern 34 may be shaped like a redistribution layer. For example, the portion of the second conductive pattern 34 may extend to come into electrical connection with at least one second interconnection line (not shown) disposed in the second structure 200. A second capping material (not shown) may be provide on the second conductive pattern 34 and on the first capping layer 24, and patterned to define a second capping layer 36 to expose the second conductive pattern 34 therethrough. The second capping layer 36 may be formed of, for example, a silicon nitride layer or a polyimide layer. A semiconductor device 300 may be fabricated through the processes described above.

FIGS. 3A to 3D illustrate cross-sectional views of a semiconductor device according to some other example embodiments of the present inventive concepts.

Figure 3A:
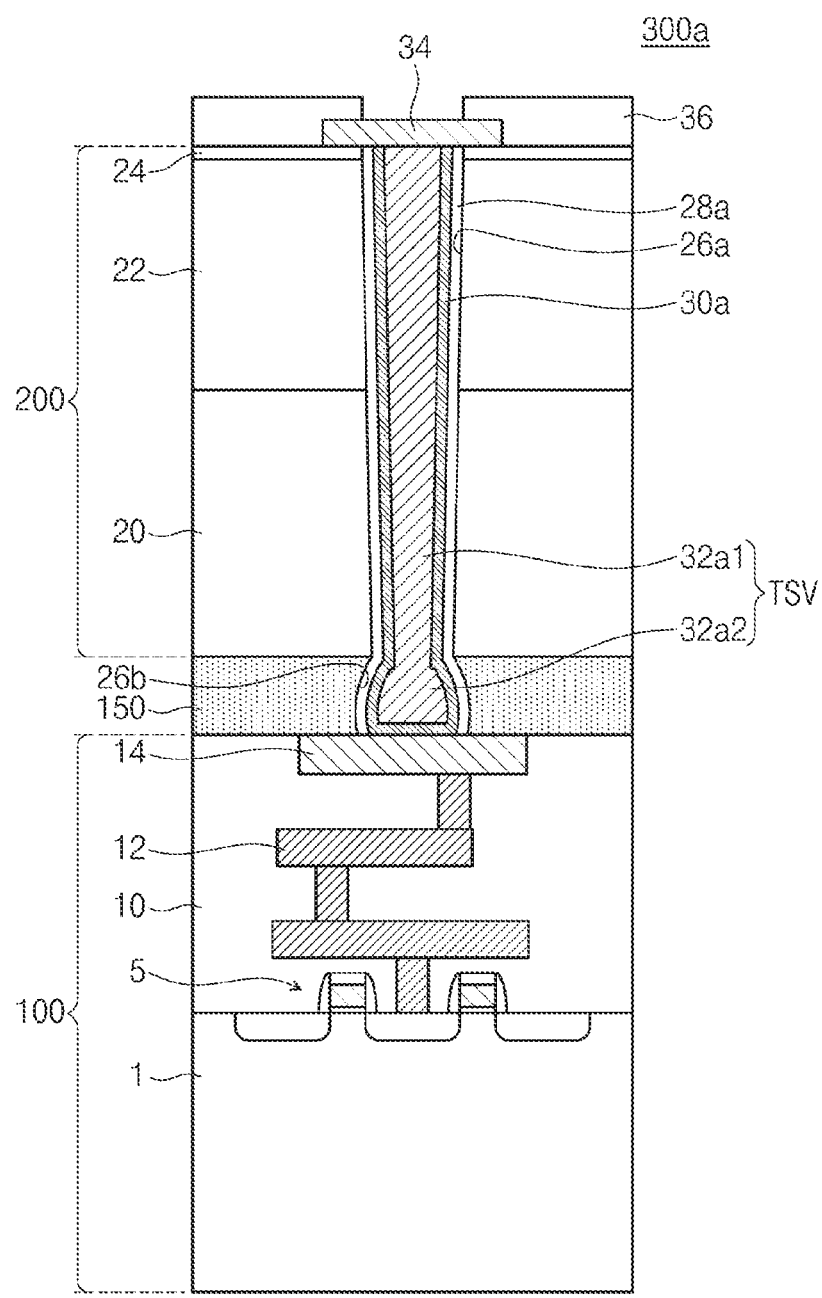
FIGS. 3A to 3D illustrate cross-sectional views of a semiconductor device according to some other example embodiments of the present inventive concepts.

Referring to FIG. 3A, in a semiconductor device 300a according to an example embodiment, the through via TSV may not include the third via segment 32a3 of FIG. 1A. Thus, the via insulation pattern 28a may not be interposed between the first conductive pattern 14 and the second via segment 32a2 of the through via TSV. Other configurations may be identical or substantially similar to those described above with reference to FIGS. 1A and 1B. The semiconductor device 300a according to this example embodiment may have a reduced contact resistance due to an increase in contact area between the through via TSV and the first conductive pattern 14. Thus, the semiconductor device 300a may have improved contact reliability. As a result, the semiconductor device 300a may decrease in power consumption and increase in reliability.

Figure 3B:
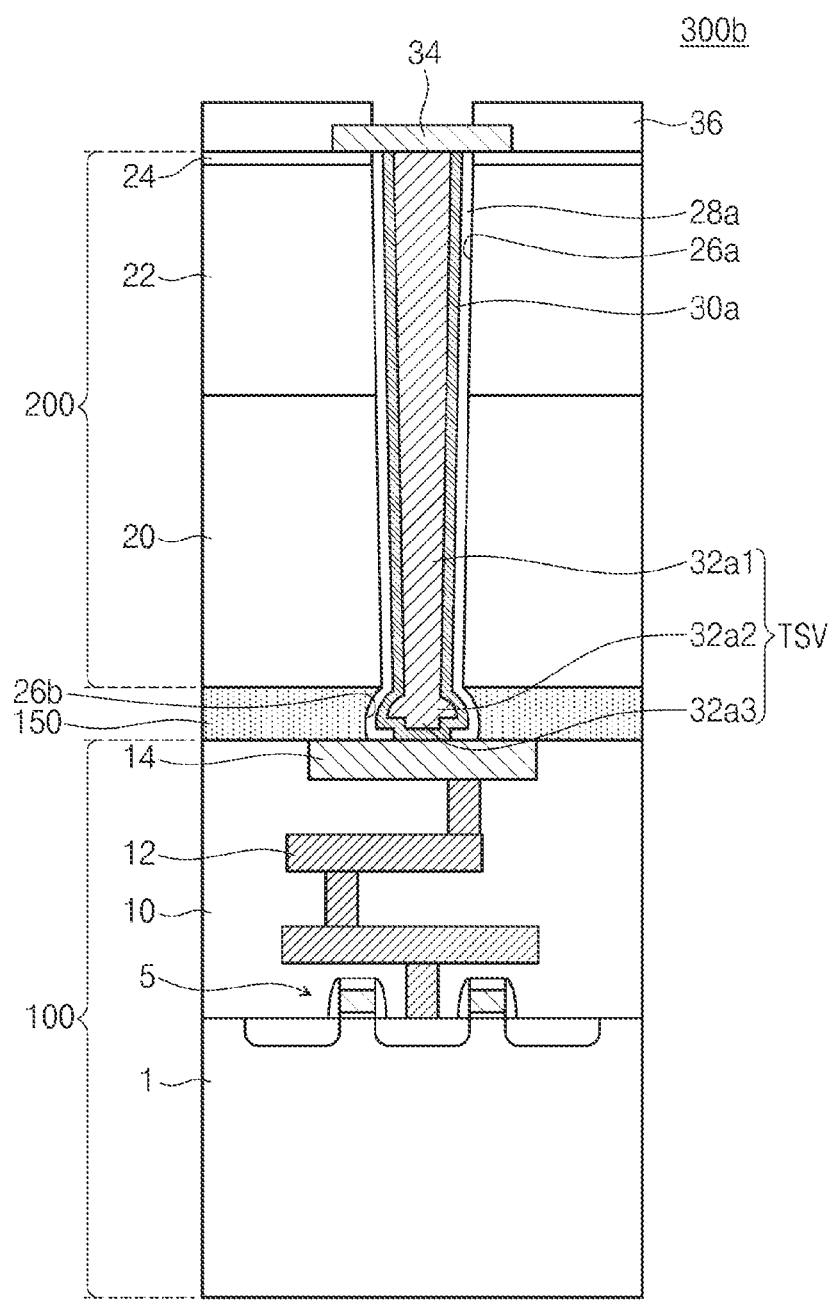

Referring to FIG. 3B, in a semiconductor device 300b according to an example embodiment, the thickness of the mold layer 150 may be relatively small. The sidewall profile of the second hole 26b may vary depending on the thickness of the mold layer 150. For example, the second hole 26b may have a sidewall profile that resembles a portion of a trapezoidal or semicircular shape. Other configurations may be identical or substantially similar to those described above with reference to FIGS. 1A and 1B.

Figure 3C:
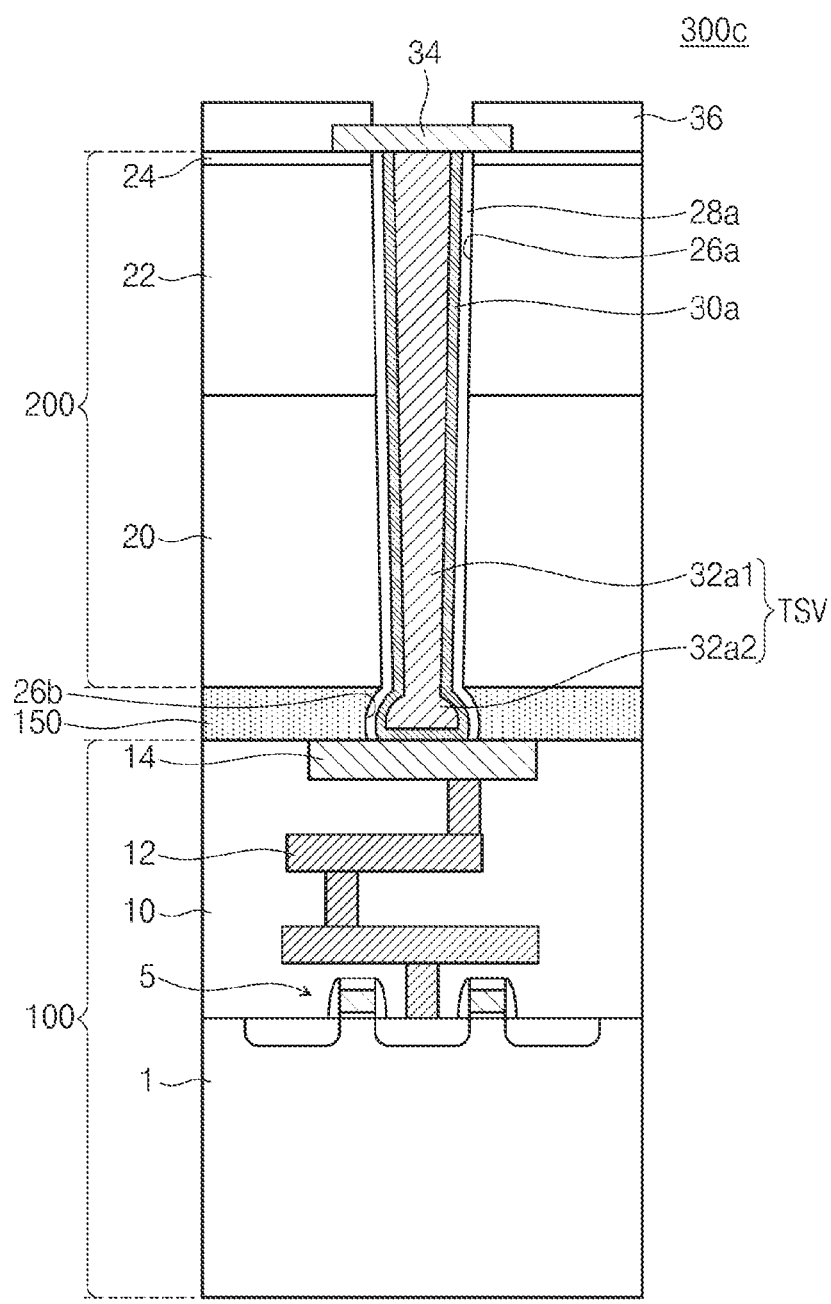

Referring to FIG. 3C, in a semiconductor device 300c according to an example embodiment, the through via TSV may not include the third via segment 32a3 of FIG. 3B. Thus, the via insulation pattern 28a may not be interposed between the first conductive pattern 14 and the second via segment 32a2 of the through via TSV. Other configurations may be identical or substantially similar to those described above with reference to FIG. 3A.

Figure 3D:
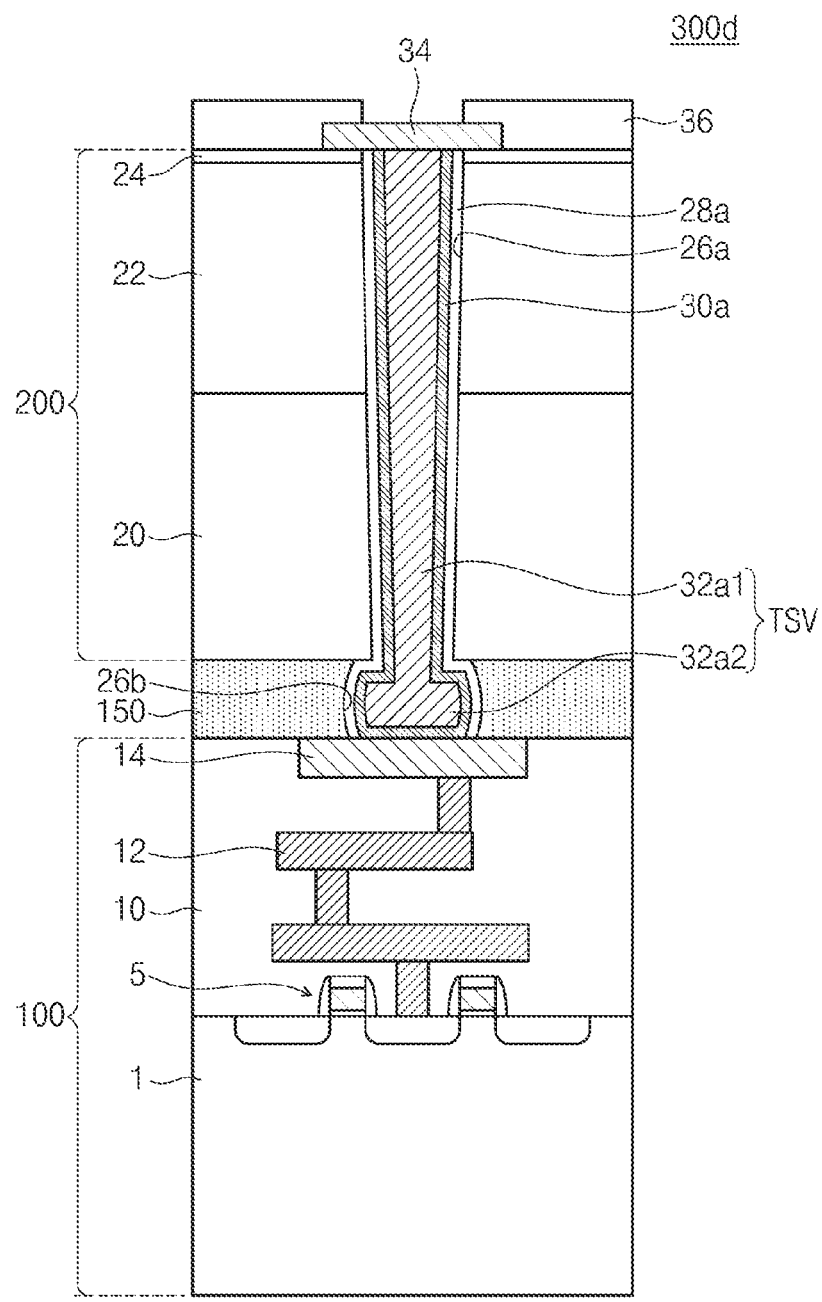

Referring to FIG. 3D, in a semiconductor device 300d according to an example embodiment, the via insulation pattern 28a may partially contact a bottom surface of the second interlayer dielectric layer 20 in the second structure 200. Other configurations may be identical or substantially similar to those described above with reference to FIG. 3A.

As shown in FIGS. 1A and 3A to 3D, the through via TSV may be formed to have various shapes by controlling or selecting at least one of the thickness of the mold layer 150, conditions of the anisotropic etching process, the concentration of the etchant used for the isotropic etching process, or the contact angle and duration time of the etchant. As such, it may be possible to control shape and size of the second via segment 32a2 of the through via TSV. Thus, contact reliability may be improved, and contact resistance may be reduced by securing a sufficient contact area.

Figure 4:
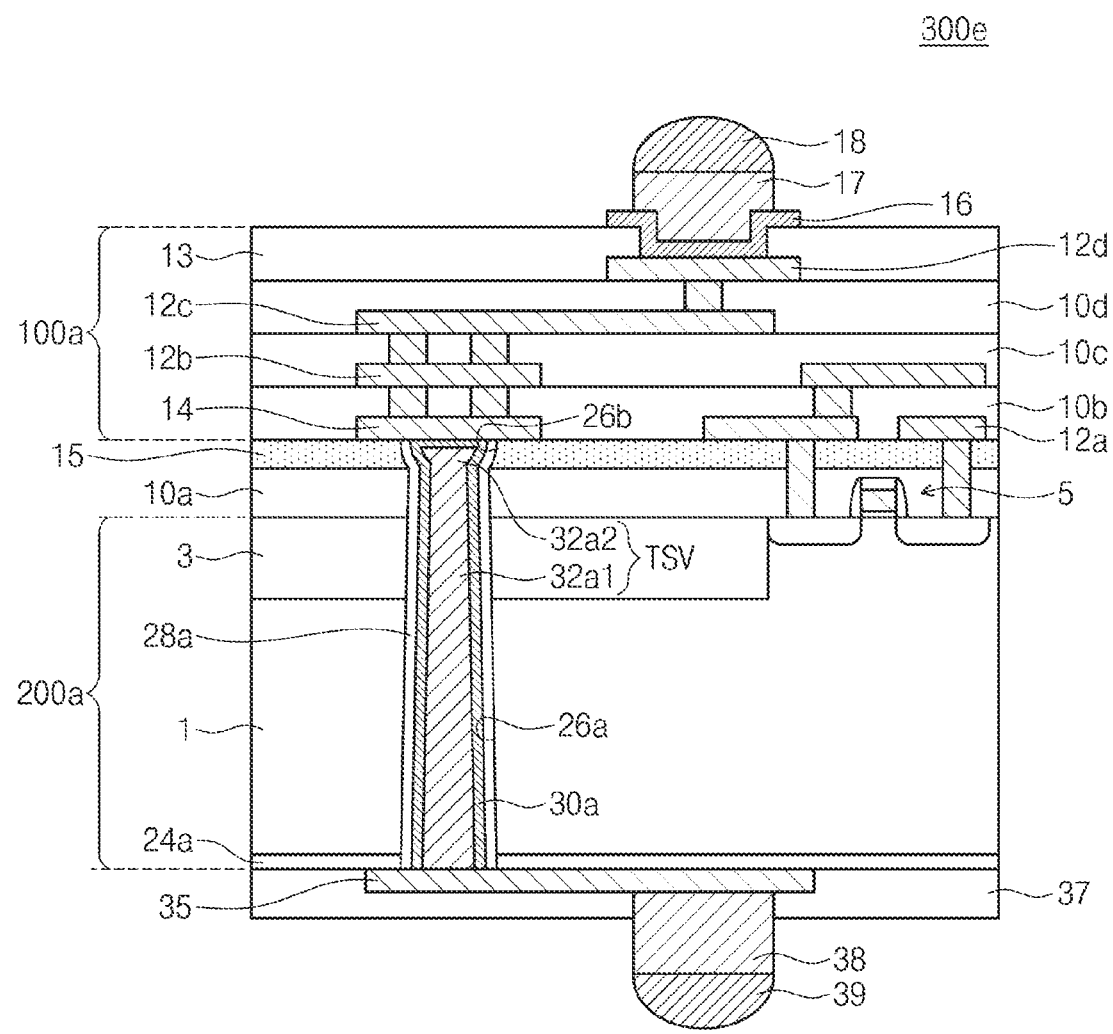
FIG. 4 illustrates a cross-sectional view showing a semiconductor device according to an example embodiment of the present inventive concepts.

FIG. 4 illustrates a cross-sectional view showing a semiconductor device according to an example embodiment of the present inventive concepts.

Referring to FIG. 4, a semiconductor device 300e according to an example embodiment may include a second structure 200a and a first structure 100a on the second structure 200a. The second structure 200a may include a semiconductor substrate 1, a device isolation layer 3, a transistor 5, and a first interlayer dielectric layer 10a covering the semiconductor substrate 1, the device isolation layer 3, and the transistor 5. The second structure 200a may further include a first capping layer 24a covering a bottom surface of the semiconductor substrate 1. A mold layer 15 may be provided between the first and second structures 100a and 200a. The mold layer 15 may be disposed on the first interlayer dielectric layer 10a. The mold layer 15 may include, for example, a polymer layer or a silicon nitride layer.

The first structure 100a may include conductive patterns 14 and 12a to 12d, second to fourth interlayer dielectric layers 10b to 10d covering the conductive patterns 14 and 12a to 12d, and an upper passivation layer 13. The conductive patterns 14 and 12a to 12d may include a first conductive pattern 14, a second conductive pattern 12a, a third conductive pattern 12b, a fourth conductive pattern 12c, and a fifth conductive pattern 12d. The first and second conductive patterns 14 and 12a may be located at the same level and spaced apart from each other. The second conductive pattern 12a may be electrically connected to the transistor 5.

A conductive pad 16 may be disposed on the fifth conductive pattern 12d. An upper conductive pillar 17 may be disposed on and be in contact with the conductive pad 16. An upper conductive bump 18 may be disposed on and be in contact with the upper conductive pillar 17.

A through via TSV may penetrate the second structure 200a and the mold layer 15, and contact the first conductive pattern 14. For example, the through via TSV may have a similar shape to that shown in FIG. 3C. The through via TSV may include a first via segment 32a1 disposed in a first hole 26a that is formed in the second structure 200a and a second via segment 32a2 disposed in a second hole 26b that is formed in the mold layer 15. A via insulation pattern 28a may include portions covering respective sidewalls of the first and second holes 26a and 26b. A via diffusion break pattern 30a may be interposed between the via insulation pattern 28a and the through via TSV.

A redistribution pattern 35 may be disposed under the first capping layer 24a. The redistribution pattern 35 may contact the through via TSV. The first capping layer 24a may be covered with a second capping layer 37. The redistribution pattern 35 may have a portion in contact with a lower conductive pillar 38. The lower conductive pillar 38 may penetrate through the second capping layer 37 and protrude outwardly. A lower conductive bump 39 may be disposed under the lower conductive pillar 38, and may be in in contact with the lower conductive pillar 38. Other structural features may be identical or substantially similar to those described with reference to FIGS. 1A and 1B.

The following describes a method of fabricating the semiconductor device 300e of FIG. 4. The device isolation layer 3 may be formed in the semiconductor substrate 1. The transistor 5 may be formed on the semiconductor substrate 1. The first interlayer dielectric layer 10a may be formed to cover the semiconductor substrate 1. The mold layer 15 may be formed on the first interlayer dielectric layer 10a. The first conductive pattern 14 and the second conductive pattern 12a may be formed on the mold layer 15. The second interlayer dielectric layer 10b, the third conductive pattern 12b, the third interlayer dielectric layer 10c, the fourth conductive pattern 12c, the fourth interlayer dielectric layer 10d, and the fifth conductive pattern 12d may be sequentially formed on the first and second conductive patterns 14 and 12a. The upper passivation layer 13 may be formed on the fifth conductive pattern 12d and on the fourth interlayer dielectric layer 10d, and then patterned to expose the fifth conductive pattern 12d. The conductive pad 16 may be formed on the upper passivation layer 13 to contact the fifth conductive pattern 12d. The upper conductive pillar 17 and the upper conductive bump 18 may be formed on the conductive pad 16 in sequence.

The first capping layer 24a may be formed on the bottom surface of the semiconductor substrate 1. The first capping layer 24a and the second structure 200a may be sequentially anisotropically etched to form the first hole 26a that exposes the mold layer 15. An isotropic etching process may be performed to etch the mold layer 15 that is exposed by the first hole 26a to form the second hole 26b that exposes the first conductive pattern 14. The through via TSV may be formed by performing processes identical or substantially similar to those described with reference to FIGS. 2D to 2G. The redistribution pattern 35 may be formed under the first capping layer 24a to contact the through via TSV. The second capping layer 37 may be formed under the first capping layer 24a and cover the redistribution pattern 35. The lower conductive pillar 38 and the lower conductive bump 39 may be formed on the redistribution pattern 35.

Figure 5:
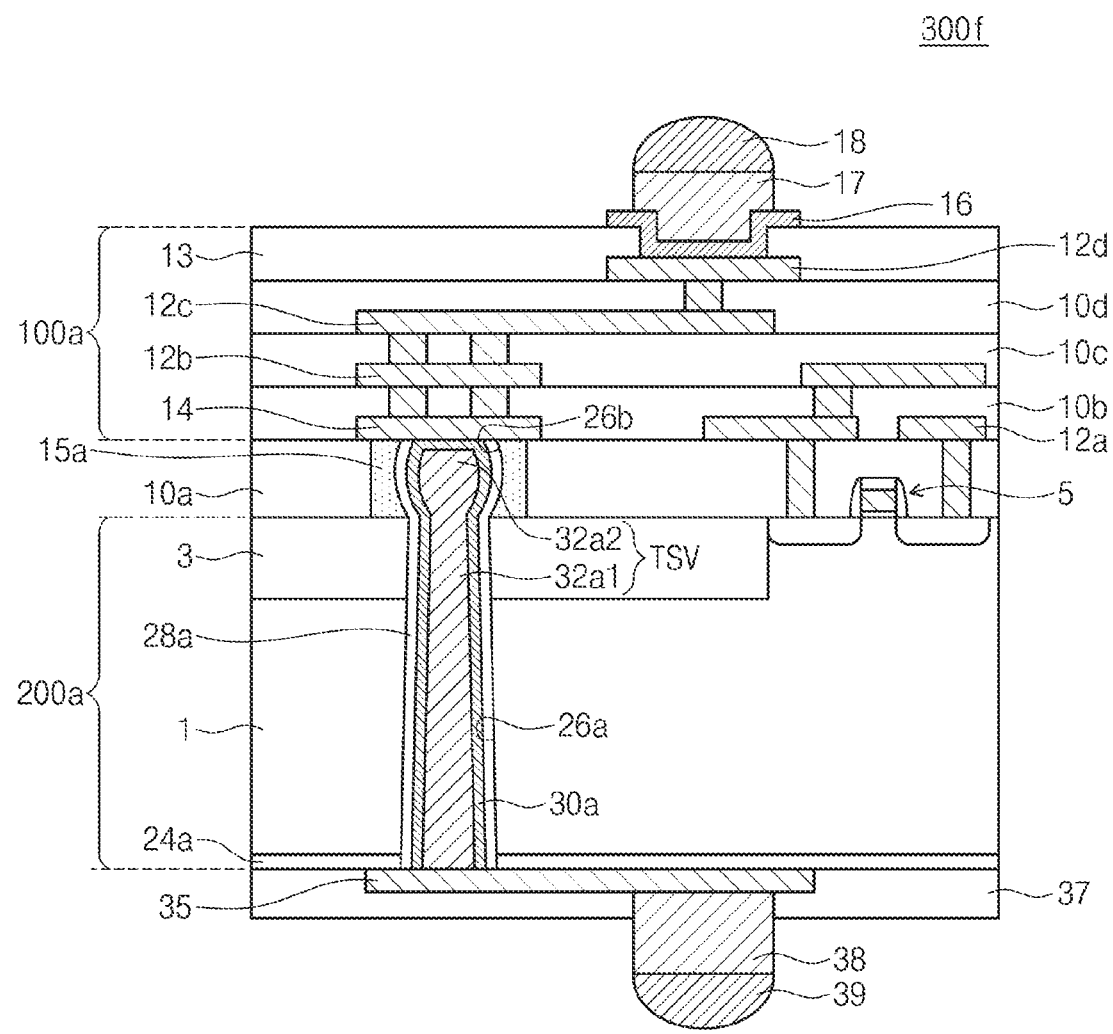
FIG. 5 illustrates a cross-sectional view showing a semiconductor device according to an example embodiment of the present inventive concepts.

FIG. 5 illustrates a cross-sectional view showing a semiconductor device according to an example embodiment of the present inventive concepts.

Referring to FIG. 5, a semiconductor device 300f according to an embodiment may include a mold layer 15a disposed in the first interlayer dielectric layer 10a. The mold layer 15a may be formed of the same material as the mold layer 150 described with reference to FIGS. 1A and 1B. The second structure 200a may include the semiconductor substrate 1 and the device isolation layer 3. The through via TSV may penetrate the semiconductor substrate 1 and the device isolation layer 3 of the second structure 200a and the mold layer 15a, and contact the first conductive pattern 14. Other structural features may be identical or substantially similar to those described above with reference to FIG. 4. The through via TSV may have a same or substantially similar shape to the through via TSV shown in FIG. 3A.

The fabrication of the semiconductor device 300f of FIG. 5 may be similar to the fabrication of the semiconductor device 300e of FIG. 4. The fabrication of the semiconductor device 300f may differ from the fabrication of the semiconductor device 300e in that the mold layer 15a is formed in the first interlayer dielectric structure 10a.

Figure 6:
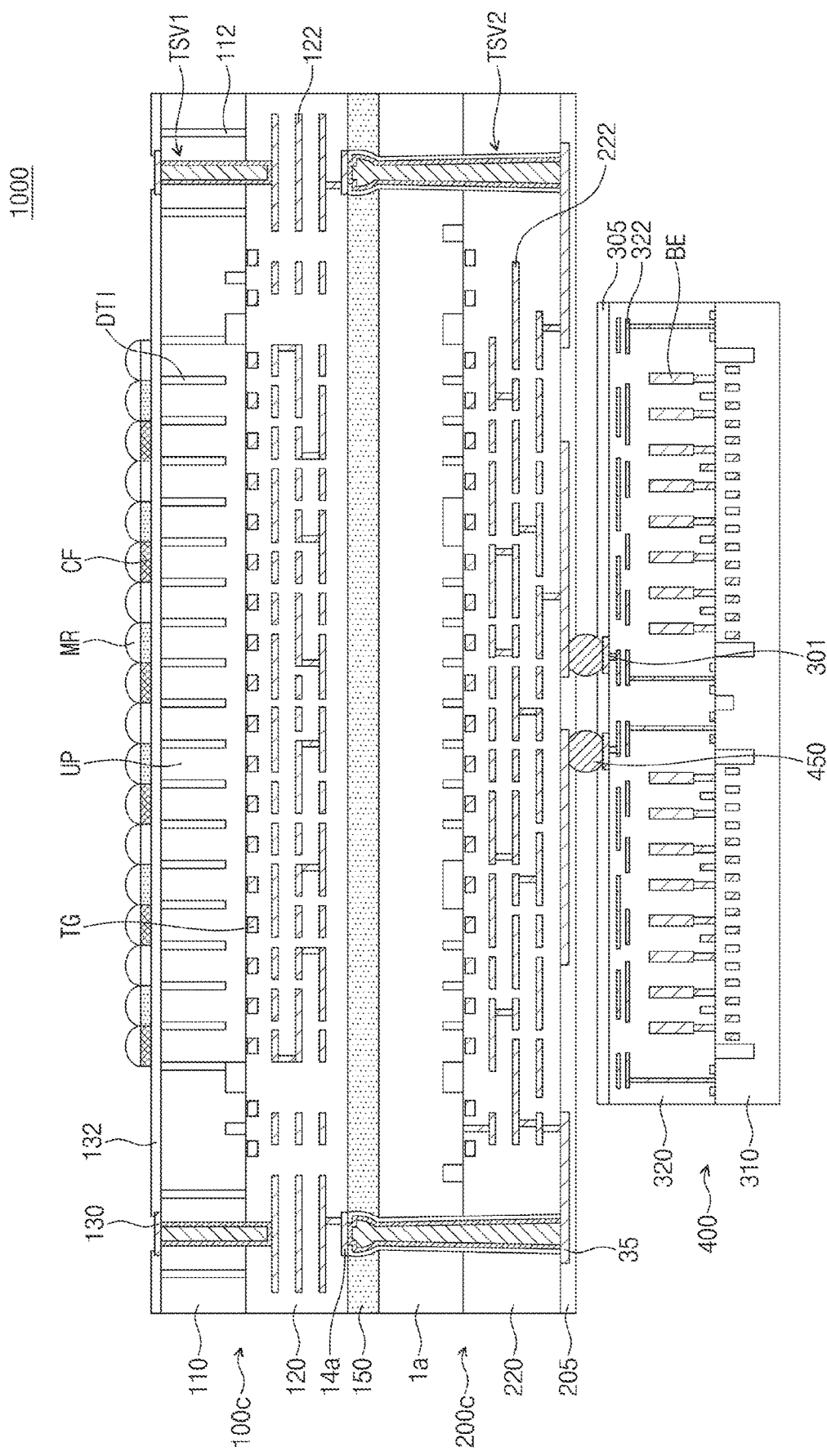
FIG. 6 illustrates a cross-sectional view showing a semiconductor package according to an example embodiment of the present inventive concepts.

FIG. 6 illustrates a cross-sectional view showing a semiconductor package according to an example embodiment of the present inventive concepts.

Referring to FIG. 6, a semiconductor package 1000 according to an example embodiment may include a first semiconductor chip 100c, a second semiconductor chip 200c mounted under the first semiconductor chip 100c, and a third semiconductor chip 400 mounted under the second semiconductor chip 200c. The first, second, and third semiconductor chips 100c, 200c, and 400 may have different functions from each other. The first and second semiconductor chips 100c and 200c may have the same width as each other. The first and second semiconductor chips 100c and 200c may have their sidewalls vertically aligned with each other. A mold layer 150 may be interposed between the first and second semiconductor chips 100c and 200c.

The first semiconductor chip 100c may be or include, for example, an image sensor chip. The second semiconductor chip 200c may be or include, for example, a logic chip that drives the first semiconductor chip 100c. The third semiconductor chip 400 may be or include, for example, a memory chip such as dynamic random access memory (DRAM).

The first semiconductor chip 100c may include a first semiconductor substrate 110 and a first dielectric structure 120 disposed on the first semiconductor substrate 110. In some example embodiments, the first semiconductor chip 100c may be upside down so that the first semiconductor substrate 110 may face upwardly the first dielectric layer 120 disposed thereon. The first dielectric structure 120 may consist of a plurality of layers including, for example, at least two or more of a silicon oxide layer, a silicon nitride layer, a silicon oxynitride layer, or a porous low-k dielectric layer. The first semiconductor substrate 110 may be provided therein with deep device isolation layers DTI that separate unit pixels UP from each other. Although not shown, the first semiconductor substrate 110 may include therein a plurality of photodiode regions each of which is disposed on a corresponding one of the unit pixels UP.

A first passivation layer 132 may cover a top surface of the first semiconductor substrate 110. First upper conductive pads 130 may be provided on the first semiconductor substrate 110 and be exposed by the first passivation layer 132. The first passivation layer 132 may be or include, for example, a silicon nitride layer or a polyimide layer. The first passivation layer 132 may be provided thereon with color filters CF that correspond to the unit pixels UP, respectively. The color filters CF may be disposed in an array shape, and micro-lenses MR may be disposed in an array shape on the color filters CF, respectively. The first semiconductor substrate 110 may be provided thereon with transfer gates TG each of which transfers charges generated in the photodiode region. The first dielectric structure 120 may include therein a plurality of first interconnection lines 122 that are electrically connected to each other. The first dielectric structure 120 may be provided thereon or therein with first lower conductive pads 14a that are electrically connected to the first interconnection lines 122. The first semiconductor substrate 110 may be provided on edge areas thereof with first through vias TSV1. Each of the first through vias TSV1 may penetrate the first semiconductor substrate 110 and a portion of the first dielectric layer 120 and be electrically connected to a corresponding one of the first interconnection lines 122. A first via dielectric layer 112 may be disposed at a location adjacent to the first through via TSV1. The first via dielectric layer 112 may be spaced apart from the first through via TSV1. Although not shown, when viewed in plan view, the first via dielectric layer 112 may surround the first through via TSV1. The first via dielectric layer 112 may insulate the first through via TSV1 from the rest of the first semiconductor substrate 110. The first via dielectric layer 112 may penetrate the first semiconductor substrate 110. The first lower conductive pad 35 may have a bottom surface coplanar with that of the first dielectric layer 120.

The second semiconductor chip 200c may include a second semiconductor substrate 1a and a second dielectric structure 220 disposed on the second semiconductor substrate 1a. The second dielectric structure 220 may consist of a plurality of layer including, for example, at least two or more of a silicon oxide layer, a silicon nitride layer, a silicon oxynitride layer, or a porous low-k dielectric layer. A plurality of transistors (not shown) may be disposed on the second semiconductor substrate 1a. The transistors may be electrically connected to a plurality of second interconnection lines 222 that are disposed in the second dielectric layer 220 and electrically connected to each other. Second through vias TSV2 may be provided on edge areas of the second semiconductor chip 200c. Each of the second through vias TSV2 may penetrate the second semiconductor chip 200c and the mold layer 150 to be connected to a corresponding one of the first lower conductive pads 14a. The second through via TSV2 may be configured identically or substantially similarly to the through via TSV described with reference to FIGS. 1A and 1B. Redistribution patterns 35 may be disposed on the second dielectric layer 220 and be electrically connected to the second through vias TSV2 and the second interconnection lines 222. A bottom surface of the second dielectric layer 220 may be covered with a second passivation layer 205.

The third semiconductor chip 400 may include a third semiconductor substrate 310 and a third dielectric structure 320 disposed on the third semiconductor substrate 310. The third dielectric structure 320 may consist of a plurality of layers including, for example, at least two or more of a silicon oxide layer, a silicon nitride layer, a silicon oxynitride layer, or a porous low-k dielectric layer. A plurality of third interconnection lines 322 may be provided in the third dielectric structure 320 and with capacitors that include bottom electrodes BE. The third dielectric structure 320 may have a top surface. Third conductive pads 301 may be provided on the top surface of the third dielectric structure 320 and be electrically connected to the third interconnection lines 322. A third passivation layer 305 may cover the top surface of the third dielectric layer 320. The third conductive pad 301 and the redistribution pattern 35 may be connected to each other through a connection member 450.

Because the semiconductor package 1000 of FIG. 6 is configured such that the second semiconductor chip 200c includes the redistribution patterns 35, the third semiconductor chip 400 may be flip-chip bonded to the second semiconductor chip 200c. In addition, the first and second semiconductor chips 100c and 200c may be connected to each other through the second through vias TSV2. Thus, a reduced connection length may be provided between the first, second, and third semiconductor chips 100c, 200c, and 400, and accordingly the semiconductor package 1000 may increase in operating speed and readout speed. Furthermore, as described above, the semiconductor package 1000 may have improved contact reliability of the second through via TSV2. When the third semiconductor chip 400 is a dynamic random access memory (DRAM) chip, position and size of input/output terminals may be standardized in order to mass produce and reduce manufacturing costs. In such cases, logic and DRAM chips may be different in size and position of input/output terminals. According to some example embodiments of the present inventive concepts, the second semiconductor chip 200c serving as the logic chip, may include the redistribution patterns 35, and thus it may be possible to increase the degree of wiring freedom for connection between the second and third semiconductor chips 200c and 400.

According to the present inventive concepts, a second structure may be etched using a mold layer as an etch stop layer, and the mold layer may be etched by using an isotropic etching process to expose an underlying conductive pattern. Thus, etching damage on a surface of the underlying conductive pattern may be prevented or reduced and/or not-open issues or incomplete etching problems may also be inhibited or mitigated. Accordingly, semiconductor devices and semiconductor packages may have improved reliability.

Although the present inventive concepts has been described in connection with some example embodiments illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
a first structure including a first conductive pattern, the first conductive pattern exposed on an upper portion of the first structure;
a mold layer covering the first conductive pattern;
a second structure on the mold layer;
a through via penetrating the second structure and the mold layer, the through via electrically connected to the first conductive pattern, the through via including,
a first via segment in the second structure, and
a second via segment in the mold layer, the second via segment connected to the first via segment, an upper portion of the second via segment having a first width, and a middle portion of the second via segment having a second width greater than the first width; and
a via insulation pattern including,
a first portion between the through via and the second structure,
a second portion between the through via and the mold layer, and
a third portion interposed between the second via segment and the first conductive pattern.

2. The semiconductor device of claim 1, wherein the through via further includes a third via segment, the third via segment connected to the second via segment, the third via segment being adjacent to the first structure, a bottom end of the third via segment having a third width less than the second width.

3. The semiconductor device of claim 1, wherein the mold layer includes a polymeric material having a dielectric constant equal to or less than about 3.

4. The semiconductor device of claim 1, wherein the first structure further includes:
a plurality of first interlayer dielectric layers; and
a plurality of first interconnection lines in the first interlayer dielectric layers and electrically connected to the first conductive pattern.

5. The semiconductor device of claim 4, wherein the first structure further includes:
a first semiconductor substrate covered with the first interlayer dielectric layers; and
a first transistor between the first interlayer dielectric layers and the first semiconductor substrate.

6. The semiconductor device of claim 1, wherein the second structure includes:
a second semiconductor substrate; and
at least one insulation layer on the second semiconductor substrate, the at least one insulation layer being in contact with the second semiconductor substrate.

7. A semiconductor package, comprising:
a first semiconductor chip including a first conductive pattern, the first conductive pattern exposed on an upper portion of the first semiconductor chip;
a mold layer contacting the first conductive pattern and covering the first semiconductor chip;
a second semiconductor chip on the mold layer; and
a through via penetrating the second semiconductor chip and the mold layer, the through via electrically connected to the first conductive pattern, the through via including,
a first via segment in the second semiconductor chip, and
a second via segment in the mold layer, the second via segment connected to the first via segment, an upper portion of the second via segment having a first width and a middle portion of the second via segment having a second width greater than the first width,
wherein the first via segment and the second via segment constitute the through via of a single unified body, and
wherein the second via segment has a curved sidewall.

8. The semiconductor package of claim 7, wherein the through via further includes a third via segment, the third via segment connected to the second via segment, the third via segment being adjacent to the first semiconductor chip, a bottom end of the third via segment having a third width less than the second width.

9. The semiconductor package of claim 7, further comprising:
a via insulation pattern including a first portion between the through via and the second semiconductor chip and a second portion between the through via and the mold layer, the via insulation pattern including a third portion interposed between the second via segment and the first conductive pattern.

10. The semiconductor package of claim 7, wherein the mold layer includes a polymeric material having a dielectric constant equal to or less than about 3.

11. The semiconductor package of claim 7, further comprising:
a third semiconductor chip bonded to the second semiconductor chip.

* * * * *